United States Patent
Leyh et al.

(10) Patent No.: US 6,993,296 B2
(45) Date of Patent: Jan. 31, 2006

(54) MULTIMODE BACKGROUND SCANS OF DIFFERENT COMMUNICATION SYSTEMS ON SIMILAR FREQUENCIES

(75) Inventors: Arthur C. Leyh, McHenry, IL (US); Joseph Cramer, III, Woodstock, IL (US); Christopher Kurby, Elmhurst, IL (US); Brian Storm, Round Lake Beach, IL (US)

(73) Assignee: Motorola, Inc., Schaumburg, IL (US)

( * ) Notice: Subject to any disclaimer, the term of this patent is extended or adjusted under 35 U.S.C. 154(b) by 152 days.

(21) Appl. No.: 10/368,709

(22) Filed: Feb. 19, 2003

(65) Prior Publication Data

US 2004/0176039 A1    Sep. 9, 2004

(51) Int. Cl.
*H04B 1/44* (2006.01)

(52) U.S. Cl. .......................... 455/78; 455/296; 455/24; 455/67.13

(58) Field of Classification Search .................. 455/78, 455/73, 550.1, 83, 69, 67.11, 67.13, 296, 455/311, 254.3, 232.1, 240.1; 370/332
See application file for complete search history.

(56) References Cited

U.S. PATENT DOCUMENTS

| | | | |
|---|---|---|---|
| 5,630,224 A * | 5/1997 | Swail | 455/296 |
| 6,591,086 B1 * | 7/2003 | Pleasant | 455/78 |
| 6,618,365 B1 * | 9/2003 | Vannatta et al. | 370/333 |
| 2003/0119547 A1 * | 6/2003 | Leyh et al. | 455/552 |

* cited by examiner

*Primary Examiner*—Quochien B. Vuong
*Assistant Examiner*—Lewis West
(74) *Attorney, Agent, or Firm*—Brian M. Mancini; Randall S. Vaas (57) ABSTRACT

A method for increase receiver efficiency in a multimode communication device includes a first step of monitoring a received signal strength of a neighboring cell on a receiver channel. A next step includes determining a noise on the receiver channel from a transmitter power amplifier of the communication device. A next step includes comparing the level of interference with a predetermined threshold and with respect to the signal strength. A next step includes blanking the receiver when the transmitter power amplifier of the communication device is on and if the predetermined threshold is not exceeded indicating excessive self-interference.

18 Claims, 4 Drawing Sheets

MULTIMODE BACKGROUND SCANS OF DIFFERENT COMMUNICATION SYSTEMS ON SIMILAR FREQUENCIES

FIELD OF THE INVENTION

The present invention relates to the control of an operating mode of a radio communication device. More particularly the invention relates to a method for operating a multimode radio communication device on different communication systems.

BACKGROUND OF THE INVENTION

New digital cellular communication systems, such as the Wideband Code Division Multiple Access (WCDMA) extension of the Global System for Mobile Communication (GSM) and Digital Cellular System (DCS) can utilize different operating modes for the transfer of digital information. For example, digital information can be transferred using two different duplex modes, Frequency Division Duplex (FDD) and Time Division Duplex (TDD), as are known in the art, and using different operating frequency bands. Allowing operation in the different FDD and TDD modes provides more efficient spectrum utilization. In addition, a communication can share CDMA and Time Division Multiple Access (TDMA) aspects. The GSM system operates in the 900, 1800 and the Universal Mobile Telecommunications System (UMTS) operates in the 1900/2100 MHz band, while the DCS system also operates in the 1800 MHz band.

Multi-mode communication devices are designed to transmit and receive digital communications using operating systems chosen from a plurality of multiple access techniques including TDMA, CDMA, GSM, and DCS, and will combine some of these techniques and incorporate them into one communication device. The receiver portion of a multimode communication device for example, is similar to those which are not multi-mode but are adapted to receive a combination of signals in accordance with any of the systems above. For example, a device operating in a FDD mode can be transmitting in an uplink (UL) on one operating system and receiving on a downlink (DL) on another operating system. In addition, the device is required to occasionally monitor various channel frequencies (FDD, TDD, GSM) of these systems to look for control channels of new base stations.

Unfortunately, in those cases where the monitoring (receiving) frequency is close to the uplink transmission frequency (i.e., frequencies in the TDD or GSM/DCS 1800/1900 MHz bands), the communication device can actually interfere with itself. For example, the transmit power of the device transmitting in DCS mode (1800 MHz) is picked up by, and interferes with, the receiver of the device, which degrades its sensitivity of WCDMA signals in the UMTS band (2100 MHz). This degradation is due to undesired co-channel noise present at the antenna as a byproduct of the amplification of the transmit signal or the transmit signal itself acting as an out of band blocker. While in a GSM call in the DCS band, an accurate evaluation of a neighbor cell in the UMTS band, having moderate to low received signal strength at the communication device, is not easily accomplished.

One solution to the problem is to simply not allow the DCS transmitter to be on at the same time as a WCDMA neighbor cell operating in the UMTS band is being evaluated by the communication device. While this solution is effective in reducing the problem somewhat, it is also difficult to accomplish since the two communication systems (i.e. transmission and reception systems) are not synchronized. Synchronization is an issue because WCDMA systems require decoding of a pilot channel to detect nearby cells, since simply measuring power is not sufficient. This can present problems since the pilot channel, primary synchronization channel (P-SCH), and secondary synchronization channel (S-SCH) information may not be available from the base station when the DCS transmitter is inactive. In addition, the GSM system does not allow for missed frames. Therefore, the receiver has to wait for another frame until the WCDMA pilot information is available between GSM transmit slots. In order to do this correctly, the device must have knowledge of the system timing of the neighbor cell before trying to decode it, and even then there are only specific times when the two systems are not colliding. By not allowing the WCDMA neighbor cell operations to occur while the DCS transmitter is on, the neighbor cell monitoring efficiency is degraded compared to the single mode case.

Another solution to prevent self-interference is to put a filter in the DCS transmit path to eliminate the noise in the WCDMA receiver band. However, due to the proximity of the band, a high-order filter with excessive loss must be used. This causes an increase in power demanded from the transmitter power amplifier. The results of these inefficiencies are higher current demanded from the battery and excessive heat generated by the transmitter circuitry. Moreover, the filter adds cost to the device and an increase in printed circuit board area is needed to place the filter. Further, the filter would not be effective in all cases and does not address the blocking issue.

In practice, typical receiver circuitry in a communication device comprises two general portions: a front end portion and a back end portion. The front end portion functions to perform initial filtering, amplification of the desired bandwidth, and conversion to an intermediate frequency for further processing by the backend portion of the receiver. The backend portion converts the signal to the baseband in preparation for digital signal processing. RF signals enter the front end portion via the antenna and are transferred from the front end to the back end. Controlling the incoming signal power to an RF receiver is essential to maintain signal levels within the operating range of the baseband circuitry and provide proper operation of the receiver. Out-of-band signal power degrades receiver performance as a result of a decreasing signal-to-noise ratio and receiver selectivity. This may occur when interfering adjacent signals are very strong compared to the desired on-channel signal, such as when a device is transmitting on the uplink while monitoring on a downlink at a nearby frequency. This results in the desired on-channel signal becoming desensitized due to out-of-band noise. Therefore, it is necessary to limit the received signal power prior to the baseband circuitry and maintain signal levels within the back end circuit's operating range. Filter portions of the baseband circuitry can reduce the adjacent interference noise signals by allowing only the desired on-channel frequency to pass through. However, the incoming aggregate power level prior to the baseband circuitry comprises the desired monitored signal as well as the interfering uplink energy, which limits the usefulness of filtering.

Therefore, there is a need to alleviate the problems of sensitivity degradation during receiver monitoring in a multimode communication device. It would also be of benefit to increase the efficiency of neighboring cell monitoring without requiring timing information of both systems simultaneously. It would also be advantageous to provide these improvements without any significant additional hardware or cost in the communication device.

DETAILED DESCRIPTION OF THE PREFERRED EMBODIMENTS

The present invention uses receiver blanking (i.e. turning the receiver off or reducing the receiver gain such that it is effectively off) to increase the efficiency of the neighbor cell evaluation without suffering the inefficiencies inherent in the current solutions. In addition, the present invention does not require timing knowledge of both systems simultaneously nor does it require an additional filter. Further, none of the techniques used in the present invention result in inefficiencies inherent to inserting a filter in the transmit path. Moreover, there is no need to schedule a background scan around transmit pulses. Additionally, the present invention does not need to know exactly when to look for the pilot information from the neighbor cell and determine when this information falls between transmit slots. This allows background scanning to be optimized for quicker scanning rates and simplified software and control complexity. Lastly, this improvement is accomplished without any additional hardware or cost in the communication device. Instead of adding circuitry, which in turn adds cost and increases the device size, the present invention advantageously utilizes the existing circuitry in combination with software solutions for the processing of the RF signals from multiple bandwidths necessary in a multimode communication device.

The present invention provides several novel techniques to deal with the interference that is generated by the GSM power amplifier module operating in the DCS band. The chosen technique depends on the relative power levels of the noise generated by the transmitter and the receive power level from neighbor cells which are being scanned. Since the GSM system does not allow for missed frames, the transmitter must operate at the designated times. The present invention mitigates the noise problem from the transmitter by providing several operational techniques to control the receiver operation.

A first technique includes monitoring a received signal strength of a neighboring cell on a receiver channel and measuring the noise added from the power amplifier. Given the received signal strength, it is also possible to predict or estimate the noise that would be produced from the amplifier given a required power amplifier gain and a known gain/noise profile for the device. If the signal-to-noise ratio is above a predetermined threshold then no receiver blanking need be done. In other words, if the neighbor cell has sufficient power such that the added noise from the power amplifier module would not prevent the receiver from operating properly then no receiver blanking is needed and the device will operate properly even with the interference.

A second technique includes always blanking the receiver and putting the AGC loop in hold mode at any time that the transmitter is on. If the noise generated by the transmitter is dramatically higher than the power received from the neighbor cell then the receiver's gain setting can be affected. In other words, the receiver Automatic Gain Control (AGC) can lock onto the noise rather than the signal (i.e. AGC falsing). Blanking the receiver eliminates any AGC falsing due to transmitter noise since the AGC loop in placed hold mode. In this technique, the receiver only loses the data that is sent while the transmitter was on. Since the AGC loop is held, the correlator used for performing cell detection and measurement operations works without the knowledge that anything has happened, and can operate normally to reacquire the signal. However, the correlator will take a correspondingly longer time to converge on the signal. This can be of concern since the correlator has a set timeout period to acquire a signal, after which, if no signal has been acquired, the correlator stops, which is interpreted as no signal being present.

A third technique is similar to the second technique in that it includes blanking the receiver and putting the AGC loop in hold mode at any time that the transmitter is on. However, this technique forces an increase in the timeout for correlation. This gives the correlator sufficient time to acquire the signal in compensation for the AGC loop being off during the time the transmitter is on. If enough data is lost during the time that the AGC loop is held, then the receiver has an extended time period to correlate before deciding whether there is good correlation.

A fourth technique includes blanking the receiver during the time that the transmitter is on and increasing the correlation gain during the entire correlation time. The increased correlation gain will result in a reduced amount of time to acquire the signal. The gain can be adjusted once for the entire correlation period or can be changed dynamically depending on signal and noise levels. Changing gain is done in software by shifting values left or right in the correlator accumulator. Alternatively, and if signal levels are sufficient for reception while the transmitter is on as described in the first technique, dynamically increasing correlation gain can be done without receiver blanking to reduce the effects of interference.

The techniques described are such that a combination of any or all of the above techniques can be used.

Blanking the receiver while the transmitter is on can be achieved by either tying the hardware amplifier control to circuitry that can override the existing receiver control, or by having software do the comparison and blanking. It should be realized that there are many other ways to control receiver blanking, and that the present invention is not limited by the examples described herein.

Figure 1:
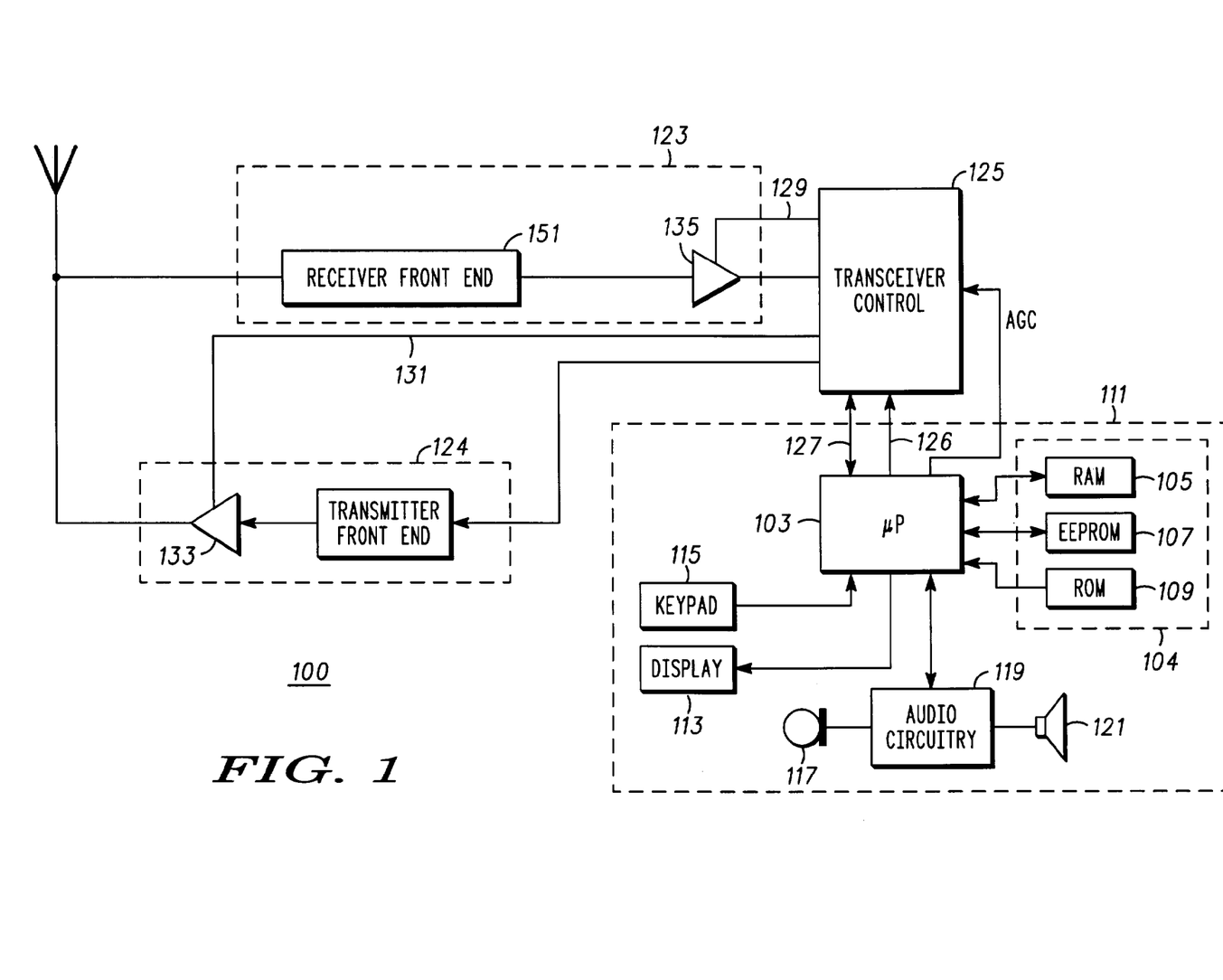
FIG. 1 shows a simplified block diagram of a multimode communication device, in accordance with the present invention.

Turning to FIG. 1, a simplified block diagram of a wireless communication device is shown, in accordance with the present invention. Preferably, this device is a cellular radiotelephone incorporating the present invention. A microprocessor 103, such as a main control unit, digital signal processor and the like generates the necessary communication protocol for operating in the compatible cellular systems. The microprocessor 103 uses memory 104 comprising RAM 105, EEPROM 107, and/or ROM 109, preferably consolidated in one package 111, to execute the steps necessary to generate the protocol and to perform other functions for the wireless communication device, such as writing to a display 113, accepting information from a keypad 115, or communicating control signals 126 and data 127 with the transceiver control 125, which includes controlling the receiver operation, in accordance with the present invention. The transceiver control 125 also includes a receiver analog-to-digital converter, a transmitter digital-to-analog converter, drivers and other transceiver circuitry which will not be described here for simplicity. The transceiver control 125 and/or the microprocessor 103 includes a demodulator, synthesizer, digital signal processor (DSP), and other circuitry known in the art to perform baseband conversion and appropriate active filtering which is necessary for modulation and demodulation of the desired communication signal. The microprocessor 103 also processes audio transformed by audio circuitry 119 from a microphone 117 and to a speaker 121.

FIG. 1 also shows one channel 151 of the front end receiver circuitry 123 which is capable of receiving RF signals from distinct frequency bandwidths which is required for operation of a multi-mode communication device 100. Optionally, additional receiver channels (not shown) can be included in the communication device and be operable in accordance with the present invention. A transmit path 124 is also shown which transmits RF signals on distinct frequency bandwidths which is required for operation of a multimode communication device 100. It is envisioned that the communication device 100 is operable on the 800, 900, 1800, 1900 MHz GSM/DCS and WCDMA bands. For example, the front end receiver is capable of operating in a WCDMA communication mode and the transmitter is capable of operating in a GSM communication mode.

The transceiver control 125 includes a synthesizer (not shown) that can contain an IF pre-amp, an IF mixer, an active baseband filter, and an analog-to-digital converter, as are known in the art, for example. The IF pre-amp uses automatic gain control (AGC) to control the aggregate signal gain input to the baseband mixer and the active baseband filter, since both are susceptible to overload. The AGC maintains the baseband circuitry power level within the designed operating range so the receiver can function properly. The baseband IF mixer converts the IF signal into a second IF frequency which is then subsequently filtered by active baseband filter that allows only the desired communication signal to pass for further processing. Although filtered, noise and interference on the desired communication signal frequency passes on to further processing. After the filter, the signal is converted to a digital signal by the analog-to-digital converter. This converter takes all signals (desired communication signal and interference) and converts them to digital data bits which are then subject to further signal processing including additional soft filtering and demodulation.

The transceiver control 125 comprises a detector for detecting self-interference, in accordance with the present invention. The detector estimates the power of the self-interference passed though the receiver channel and provides this estimate to the microprocessor 103 which comprises determining means to compare the signal with estimated or measured signals to determine whether self-interference is present or whether the signal being received is a true received signal.

In accordance with the present invention, either of the microprocessor 103 or transceiver control 125 can be used to determine if receiver blanking, AGC locking, and/or correlator gain control is actually needed under the current cell conditions. In short, the receiver is used as an estimator of the self-interference of the communication device (such as from a WCDMA uplink interfering with a DCS downlink for example), and only if such self-interference is found would the receiver gain stage 135 be blanked, by control signal 129, to eliminate the self-interference. If there is (or there is estimated to be) a substandard correlation on a (WCDMA) frequency at the same time that the (GSM) transmitter 133 is being pulsed on (by control signal 131), the receiver front end gain control 129 is directed to turn off or substantially reduce the gain of the receiver gain stage 135 to blank the receiver path during the transmitter 133 pulse. Afterwards, if there is still no correlation, then the correlation time and/or correlation gain is increased. At any other time, the communication device can operate normally thereby increasing capacity.

The choice of using gain control, correlation time, and correlation gain can be chosen serially as presented in the order above or can be chosen directly using the most effective means given known information of the cell. For example, if the cell was measured recently while not in a GSM call, then the relative power is known and the proper choice (i.e. receiver gain control, correlator time control, or correlator gain control) can be made. Additionally, if the cell was successfully measured using a certain technique while in a call, the same technique can first be chosen as was previously used.

In practice, self-interference is band dependent. For example, WCDMA has limited selectivity to self-generated TDD and GSM transmit noise in the receive path, and the present invention has best effect in this situation. The requirements are actually conditional when many parameters are taken into account. Primarily, the microprocessor utilizes measured signal strength from: the detector, known uplink frequency, known downlink frequency, and the communication device's transmitter power, in determining whether there is, or will be, a high enough level of self-interference to warrant receiver blanking. Other secondary parameters can also be taken into account including filter selectivity, actual transmit noise, and coupling effects.

In application, the present invention is best utilized in the WDCMA band due to its limited selectivity. However, the present invention has application in any multimode communication system wherein a reception frequency is nearby a simultaneous wideband transmission frequency. In addition, the present invention has application in a Global Positioning System wherein the time to correlate a received GPS system signal is long. The potentially worst-case self-interference noise is for a TDD transmitter at full power on the highest channel closest to the receiver monitoring channel, such as a DCS uplink at or near 1785 MHz and a UMTS downlink at or near 2110 MHz. A receiver under these conditions would have about a −35 dB desense (i.e. the sensitivity at the 2110 MHz channel can be down about 35 dB due to the transmitter noise caused interference). In this case, if the desired received signal strength was greater than 35 dB above the receiver sensitivity or the transmitter was transmitting below full power, then proper reception can take place.

In order to perform a cell search on a (WCDMA) cell, three steps are required: a) acquire slot synchronization through the process of correlating the primary synchronization code with the received primary synchronization channel (P-SCH) data, b) acquire frame synchronization and scrambling code group identification through the process of correlating all of the secondary synchronization code sequence shifts with the received secondary synchronization channel (S-SCH) data, and c) determining one of the eight primary scrambling codes (with fifteen subcodes) by correlating with the common pilot channel (CPICH), with the result allowing the decoding of the primary common control physical channel to get the broadcast channel data containing the cell specific information. These steps will be explained in more detail below.

Figure 2:
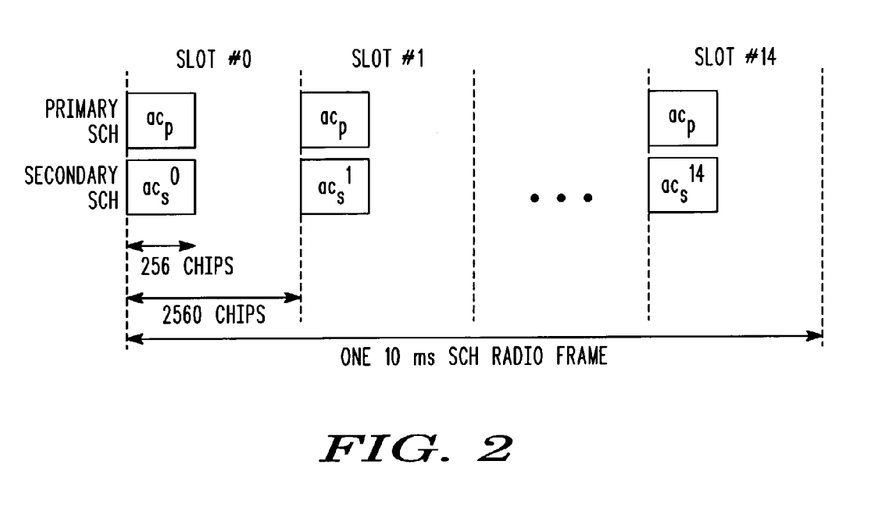
FIG. 2 shows a timing diagram of a WCDMA synchronization channel.

FIG. 2 provides an example of the timing of frame synchronization of a downlink (receive) WCDMA synchronization channel (SCH), in the operation of the present invention. It should be noted that each frame is 10 milliseconds in duration and is made up of fifteen slots, each approximately 666 microseconds long (2560 chips). 256 chips are provided to acquire slot and frame synchronization. The primary synchronization channel broadcasts the primary synchronization code, $ac_p$. The secondary synchronization channel broadcasts the fifteen subcodes, $ac_s^i$, where i=0 to 14. The synchronization channel information (both primary and secondary) is constrained to 66.6 µs is every 666 µs (one slot). Additionally, the primary SCH repeats the same primary code in every slot of every frame. However, the secondary SCH has a particular pattern of subcodes that repeat one every frame. The patterns by themselves give the slot boundaries but not the particular slot number. Hence, for the primary code there is a need to correlate each slot until the code is found. The power of the SCH can be low enough that a reasonable probability of detection cannot be achieved when correlating over a single slot. Typically, the correlation results for the primary code from each slot must be averaged over ten or more slots to get reasonable performance. For the secondary code it is necessary to capture at least a minimum number of slots of the (Reed Solomon Based) Secondary SCH sequence necessary to differentiate the scrambling code group via an accumulated correlation energy when compared to a correlation energy of all other Secondary SCH sequence cyclic shifts.

Figure 3:
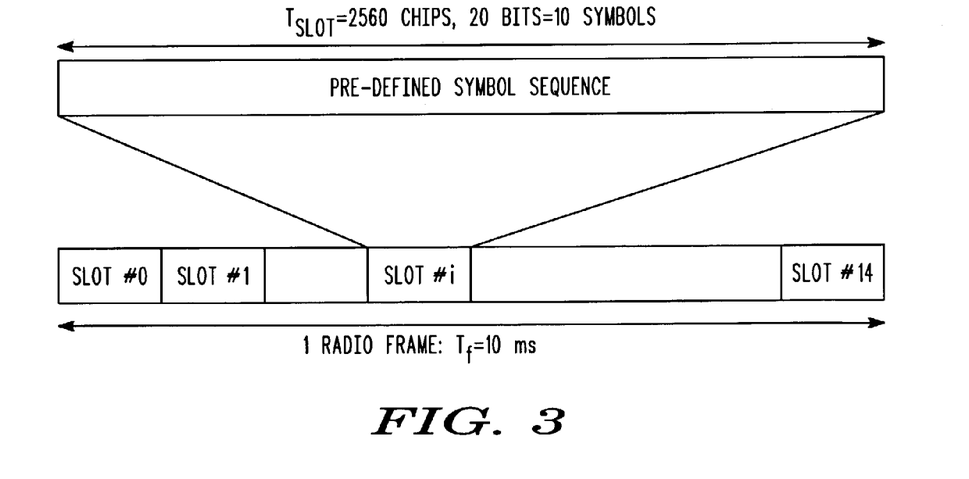
FIG. 3 shows a timing diagram of a WCDMA common pilot channel.

FIG. 3 provides an example of the timing of a common pilot channel, in the operation of the present invention. The timing of the slot is 2560 chips, which represents twenty bits of data (a sequence of ten pre-defined symbols). The 2560 chips define a pilot symbol sequence.

Figure 4:
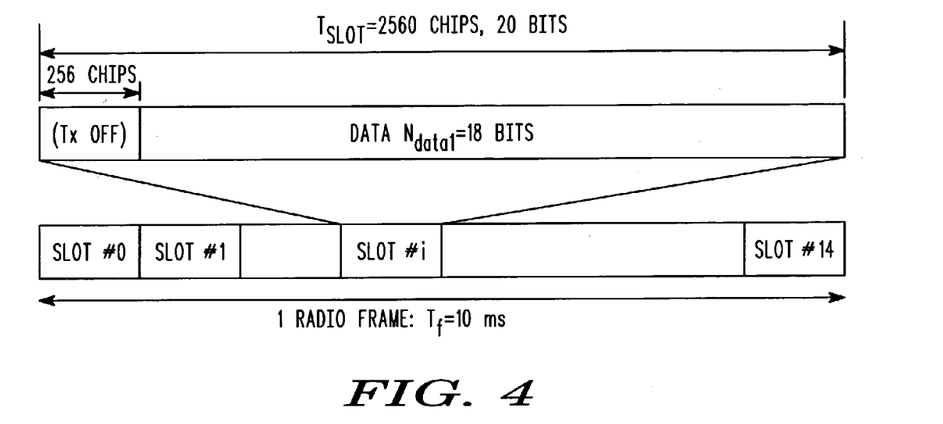
FIG. 4 shows a timing diagram of a WCDMA physical control channel.

Correspondingly, FIG. 4 provides an example of the timing of a primary common control physical channel (P-CCPCH) slot, in the operation of the present invention. The timing of the slots and the format of data is similar to the synchronization slot. However, of the twenty bits of data (ten symbols) received in the P-CCPCH, the first two bits are blank since there is no transmission, and the subsequent eighteen bits, $N_{data1}$, contain the received data.

Figure 5:
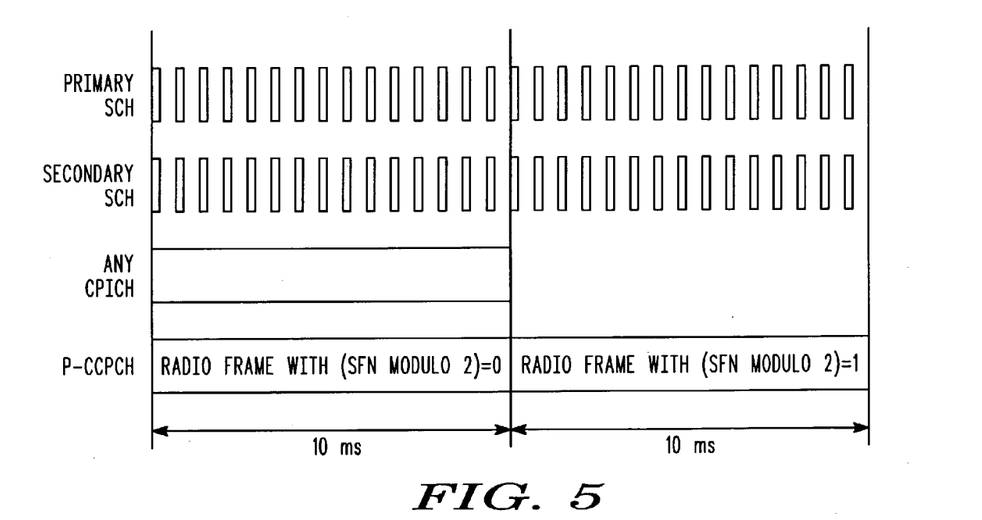
FIG. 5 shows a combination of FIGS. 2 through 4.

FIG. 5 shows the timing of two frames of the primary and secondary SCH (from FIGS. 2 and 3) along with the Primary Common Control Physical Channel (from FIG. 4), along with any common pilot channel (CPICH). SFN is the system frame number for the P-CCPCH. The primary and secondary synchronization steps are the most time and computationally intensive portions of the synchronization steps, and are made much more difficult when considering the timing of a GSM transmission, which is not synchronized to the WCDMA system and cannot be turned off.

Figure 6:
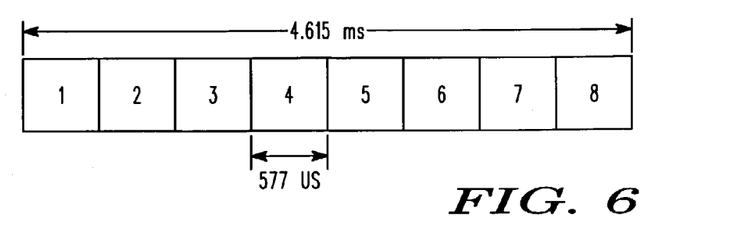
FIG. 6 shows transmitter timing for a GSM system.

FIG. 6 shows the timing diagram of a GSM transmission. In the GSM system a transmitter is active in one slot (577 µs) per frame (4.615 ms) for a circuit-switched call. Therefore, it is likely that when a GSM transmitter is on it will overlap one of the WCDMA slots, such that the blanked receiver will miss one slot of information, requiring either an extension of 666 µs of correlator time, an increase in correlator gain, or both, unless the signal-to-noise ratio is sufficiently above the interference from the GSM transmitter. To further compli-cate matters, the actual timeslot assignment of the communication device can be reassigned by the communication system either during a GSM handover or even while still in a call on the same cell. For a packet-switched GSM communication, the situation is even worse, since the GSM standard allows for up to eight slots of transmit time in any given frame.

In practice, today's communication devices transmit a maximum of two slots per frame, but they are not necessarily the same two slots, nor do they necessarily occur every frame. It would be very difficult to try to schedule a time to do a cell search where a enough contiguous time is provided to gather data from a WCDMA cell to get a correlation. If the timing calculations were not correct or if the communication system changed the timing of the transmit pulses, the subsequent correlations would not be accurate due to corrupted data resulting in the possibility of missing a valid cell.

The present invention gets around these problems by not requiring a lack of transmit activity while decoding the WCDMA Rx. The preceding figures show the relative timing of when the necessary information is available on the WCDMA downlink and the timing of the DCS uplink to illustrate the difficulty of getting the former while the latter is not present.

Figure 7:
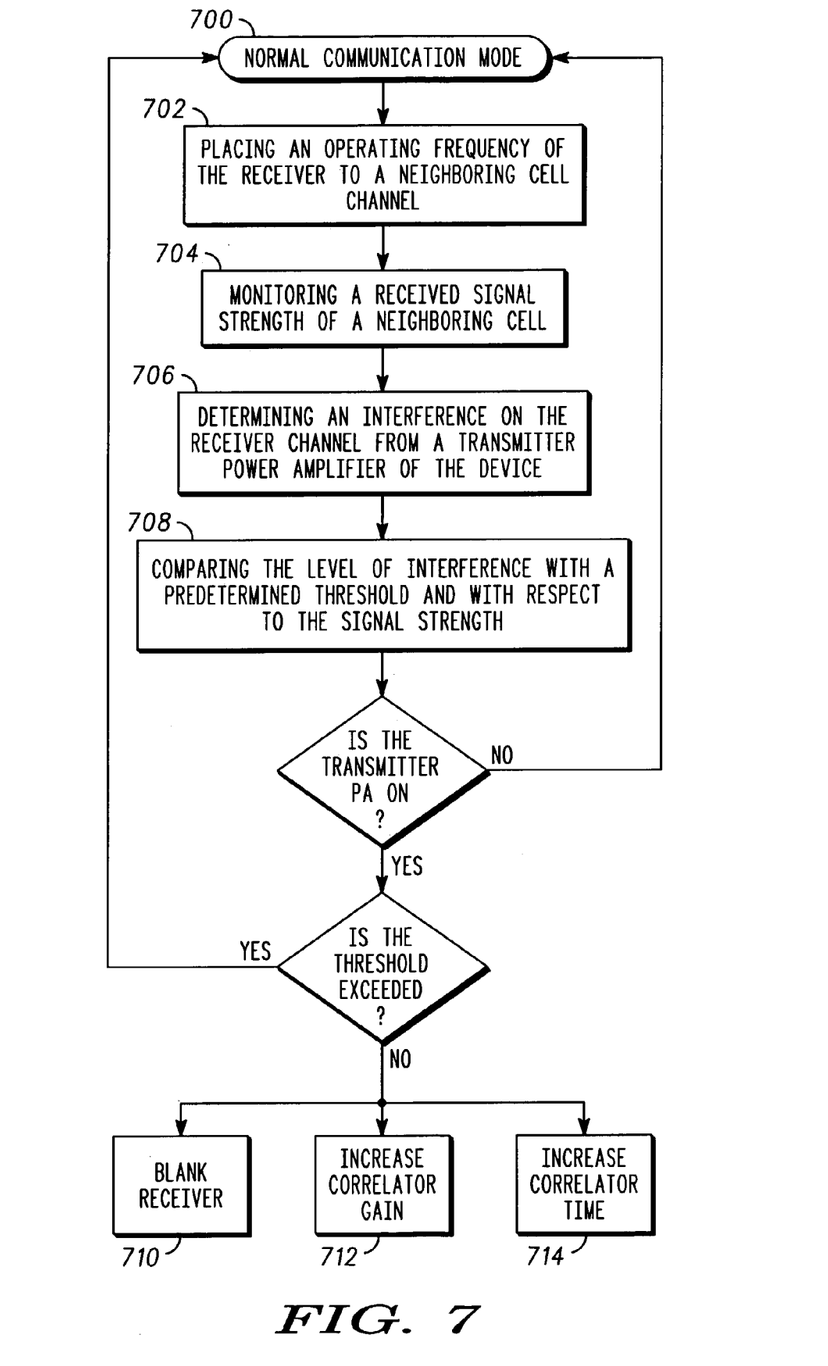
FIG. 7 is a flow chart illustrating a method of performing a multimode background scan, in accordance with the present invention.

When a neighboring cell measurement is needed by the receiver, the microprocessor can determine if receiver blanking is required using the following process in accordance with the present invention, and as represented in FIG. 7. At start up, a communication device will be operable in a normal communication mode 700. A next step 702 includes placing an operating frequency of the monitoring receiver to a neighboring cell channel, followed by monitoring 704 a received channel signal strength of a neighboring cell on the receiver channel. The monitoring step includes a determining a signal strength that can include actual signal strength or estimated signal strength.

A next step 706 includes determining an interference from the transmitter power amplifier of the communication device. A next step 708 includes comparing the level of interference with a predetermined threshold and with respect to the signal level. The threshold is used to indicate where there is excessive self-interference preventing the proper functioning of the receiver. This step can include comparing a signal-to-noise ratio, signal-to-interference ratio, carrier-to-noise ratio, energy per bit measurements, and various other measurements of the like that are known in the art. Preferably, this step 708 includes determining a desense of the receiver of the communication device, as described above, to determine a threshold. Preferably, the threshold is much above the desense level. In practice, the threshold is defined by a WDCMA carrier-to-interference ratio, wherein the receiver typically has enough sensitivity if the carrier is about 9 dB or more over the noise level. Desense can be determined occasionally to track changing channel conditions or power control, and can occur at different times in the process.

A next step 710 blanking the receiver when the transmitter of the communication device is on and if the predetermined threshold is not exceeded indicating excessive self-interference. For example, if the measured channel signal strength is much greater than the threshold (e.g. 9 dB), then it is likely there will be no significant self-interference, since any self-interference should be of the same magnitude as the estimated desense. If it is determined that there is sufficient signal strength, then the communication device can continue operation in normal mode and continue monitoring of other neighboring channels. However, if the measured signal strength is less than the threshold or close to the estimated desense, then it will be necessary to provide receiver blanking 710 when the transmitter is on, increasing 712 correlator gain, and or increasing 714 correlator time.

Preferably, the method of the present invention is best applied when monitoring channels in the WCDMA band due to the limited selectivity in this band. In practice, high power transmission in DCS 1800 mode makes it difficult to monitor WCDMA 2100 MHz cells due to the high noise generated in the WCDMA receive (Rx) band by the DCS power amplifier. In addition, the DCS1800 transmit (Tx) band and the WCDMA 2100 MHz Rx band are very close to each other (300 MHz). Moreover, a tri-band phone will also have PCS capability where the PCS Tx is up to 1990 MHz, much closer to the WCDMA 2100 band, making effective filtering difficult to design, i.e. filtering to isolating the DCS Tx band from the WCDMA Rx band would be a large and costly filter, with high insertion losses, and in consequence degrading the battery lifetime due to power consumption.

The present invention provides a solution to avoid such a filter by receiver blanking. Receiver blanking finds particular use when transmitting in DCS at high power levels and monitoring in the WCDMA band. The noise in WCDMA Rx band generated by the DCS power amplifier decreases sufficiently when the transmit output power decreases so as to meet the WCDMA sensitivity specification. The output power threshold is also dependent on the transmitter noise performances. In addition, achieving low noise in Rx band allows the communication device to bypass the DCS power amplifier for low levels. This also improves efficiency. In operation, at most times, a typical mobile communication device will be transmitting at low power levels (below 0dBm). Hence the normal WCDMA monitoring will be effective most of the time. Only occasionally would the communication device be required to blank the receiver.

The present invention finds particular application in maintaining optimum data capacity, and only modifying receiver operation where self-interference exists. The method provides a process for the communication device to control whether receiver blanking would be beneficial. The invention provides a method to reduce search time and improve the probability of neighbor cell detection when compared to standard methods wherein uncoordinated transmitter interference significantly increases the probability of missed neighbor cell detections. This is accomplished with existing hardware eliminating the need for additional circuitry hence saving space on the printed circuit board and within the integrated circuits. The ever-increasing capabilities of digital signal processor technology allows for the simultaneous measurements and operation of different modes of the communication signal to provide seamless control.

Although the invention has been described and illustrated in the above description and drawings, it is understood that this description is by way of example only and that numerous changes and modifications can me made by those skilled in the art without departing from the broad scope of the invention. Although the present invention finds particular use in portable multimode cellular radiotelephones, the invention could be applied to any multimode wireless communication device, including pagers, electronic organizers, and computers. Applicants' invention should be limited only by the following claims.

What is claimed is:

1. A method for increasing receiver efficiency in a multimode communication device, comprising the steps of:

monitoring a received signal strength of a neighboring cell on a receiver channel;

determining an interference on the receiver channel from a transmitter power amplifier of the communication device;

comparing the level of interference with a predetermined threshold and with respect to the signal strength; and blanking the receiver when tho transmitter power amplifier of the communication device is on and if the predetermined threshold is not exceeded indicating excessive self-interference.

2. The method of claim 1, wherein the blanking step also includes putting an AGC loop of the receiver in a hold mode when the transmitter power amplifier is on.

3. The method of claim 2, wherein the blanking step also includes extending a receiver correlator timeout period corresponding to the time that the transmitter power amplifier is on.

4. The method of claim 1 wherein the blanking step also includes increasing the correlation gain during the entire correlation time.

5. The method of claim 1, wherein the blanking step also includes dynamically increasing correlation gain dependant on the signal and interference levels.

6. The method of claim 1, wherein the communication device operates in a WCDMA and GSM/DCS system.

7. A method for increasing receiver efficiency in a WCDMA communication system for a communication device with a radio frequency transmitter and a radio frequency receiver for monitoring neighboring control channels operable on a communication system, the method comprising the steps of:

placing an operating frequency of the monitoring receiver to a neighboring cell channel;

monitoring a received signal strength of a neighboring cell on a receiver channel;

determining a desense of the receiver channel from a transmitter power amplifier of the communication device;

comparing the signal strength with a predetermined threshold and with respect to the desense; and blanking the receiver when the transmitter power amplifier of the communication device is on and if the predetermined threshold is not exceeded indicating excessive self-interference.

8. The method of claim 7, wherein the blanking step also includes putting an AGC loop of the receiver in a hold mode when the transmitter power amplifier is on.

9. The method of claim 8, wherein the blanking step also includes one or more of the group consisting of extending a receiver correlator timeout period corresponding to the time that the transmitter power amplifier is on, and increasing the correlation gain during the entire correlation time.

10. The method of claim 7, wherein the blanking step also includes dynamically increasing correlation gain dependant on the signal and interference levels.

11. A multimode communication device with a radio frequency transmitter and a radio frequency receiver for monitoring neighboring control channels operable on a communication system, the communication device comprising:

a transmitter with a power amplifier;

a front end portion for receiving a communication signal from a neighboring channel;

a back end portion coupled to the front end portion for correlating and converting the signal in preparation for digital signal processing;

a detector coupled to the hack end portion, the detector measuring a signal strength; and determining means for determining if a signal from the transmitter power amplifier of the communication device is interfering with the received communication signal, wherein if significant interference is determined the determining means blanks the receiver of the communication device when the transmitter power amplifier is on.

12. The communication device of claim 11, wherein the determining means utilizes the measured signal strength from the detector, and a power of the transmitter power amplifier of the communication device in determining whether there is high enough interference to blank the front end portion of the receiver.

13. The communication device of claim 11, wherein the determining means estimates a carrier-to-noise ratio of the receiver and compares this to a predetermined threshold, wherein if the carrier-to-noise ratio is less than the threshold the determining means directs the communication device to blank the front end portion of the receiver when the transmitter power amplifier is on.

14. The communication device of claim 11, wherein the detector includes an AGC circuit and the determining means place the AGC circuit in a hold mode when the transmitter power amplifier is on.

15. The communication device of claim 11, wherein the determining means extends the receiver back end portion correlator timeout period corresponding to the time that the transmitter power amplifier is on.

16. The communication device of claim 11, wherein the determining means controls a correlation gain of tile receiver back end portion and increases the correlation gain during the entire correlation time.

17. The communication device of claim 11, wherein the determining means controls a correlation gain of the receiver back end portion and dynamically increases the correlation gain dependant on the signal and interference levels.

18. The communication device of claim 11, wherein the communication device operates in a WCDMA and GSM/DCS system.

* * * * *